United States Patent [19]
Gallant

[11] 3,932,813
[45] Jan. 13, 1976

[54] EDDY CURRENT SENSOR
[75] Inventor: George A. Gallant, Burlington, Vt.
[73] Assignee: Simmonds Precision Products, Inc., Tarrytown, N.Y.
[22] Filed: Mar. 28, 1974
[21] Appl. No.: 455,742

Related U.S. Application Data
[63] Continuation of Ser. No. 245,863, April 20, 1972, abandoned.

[52] U.S. Cl. .................. 324/164; 324/173; 73/229
[51] Int. Cl.² ............................................ G01P 3/46
[58] Field of Search............ 324/34 P, 34 D, 34 GT, 324/40, 41, 161, 162, 164, 173, 174, 179; 73/229, 230, 231

[56] References Cited
UNITED STATES PATENTS
2,705,303  3/1955  Stinger................................ 324/174
3,065,412  11/1962  Rosenthal............................ 324/40

FOREIGN PATENTS OR APPLICATIONS
184,180  6/1966  U.S.S.P............................... 324/173
172,283  8/1952  Austria............................ 324/34 GT Primary Examiner—Alfred E. Smith
Assistant Examiner—Rolf Hille
Attorney, Agent, or Firm—Edwin E. Greigg

[57] ABSTRACT
An E-shaped magnetic core with a sensing coil wound around each outer leg, these coils being connected in series and the center leg made of a magnet to establish a symmetrical magnetic field. When a conductive but non-magnetic material is passed through the flux field established in the air gap between the center and outer legs, eddy currents are induced in the material which oppose and momentarily change the magnetic field inducing a detectable voltage in the coils.

4 Claims, 3 Drawing Figures

EDDY CURRENT SENSOR

This is a continuation of application Ser. No. 245,863, filed Apr. 20, 1972, now abandoned.

BACKGROUND OF THE INVENTION

The speed of turbine engines in aircraft is critical and must be determined with great precision. Commonly, the speed is sensed by an electronic pickup which senses the passage of multiple metallic protrusion from the shaft or a gear coupled auxiliary shaft, as a string of pulses which are then electronically reduced to a visual readout of engine speed.

The most common type of sensor system in the past has been an electronic oscillator which drives a resonant A.C. circuit in the sensing head at a high R.F. frequency. Passage of metal near the sensing head changes the Q of the inductance thereby changing the resonant point which is detected as a pulse. One will appreciate that the sensing head and circuitry of such a system is complex and susceptible to damage due to shock and vibration. Further, this type of system requires careful shielding and design to reduce the effects which may be introduced by stray fields and the like. The sensing head is also temperature limited by its electronics and therefore must be placed in an environment which is not detrimental to its proper functioning.

A second type of sensor utilizing eddy current principles is used, however, it is provided with a single pickup coil which makes it susceptible to stray noise pickup which interferes with the signals being produced by the shaft protrusions. This type of unit does have the advantage of having a rugged sensing head which can be placed within the engine utilizing the turbine for blades which are mounted directly on the shaft as the conductive protrusions for the sensing of speed. The presence of noise requires more complex circuitry to filter the signal to obtain the intelligence required.

The eddy current sensor revealed in the following specification represents an improvement in the art by introducing dual coil differential voltage construction which cancels most of the common mode noise voltages due to stray fields, vibration, shock, etc.

Also because of the very severe environments within a turbine engine in which this device is to be used, the physical design of the unit is critical. The very high temperatures and high vibration levels require a unit which is very rigid and can provide the stability and support for proper sensor operation.

OBJECTS OF THIS INVENTION

It is the principal object of this invention to provide a sensor which will detect the passing of non-magnetic but conducting materials in close proximity and at high speed.

It is another object of this invention to provide a sensor which will detect the passing of non-magnetic but conducting materials in close proximity and at high speed and is constructed so as to cancel the effects of stray magnetic fields and random noise.

Still another object of this invention is to provide a sensor which is rigid and vibration resistant for use in aircraft turbine engines.

Yet another object of this invention is to provide a sensor which will withstand the internal temperature of aircraft engines for inclusion therein.

These and other objects of this invention will become clear upon careful study of the following specification together with the drawings and appended claims.

DESCRIPTION OF THE PREFERRED EMBODIMENTS

Figure 1:
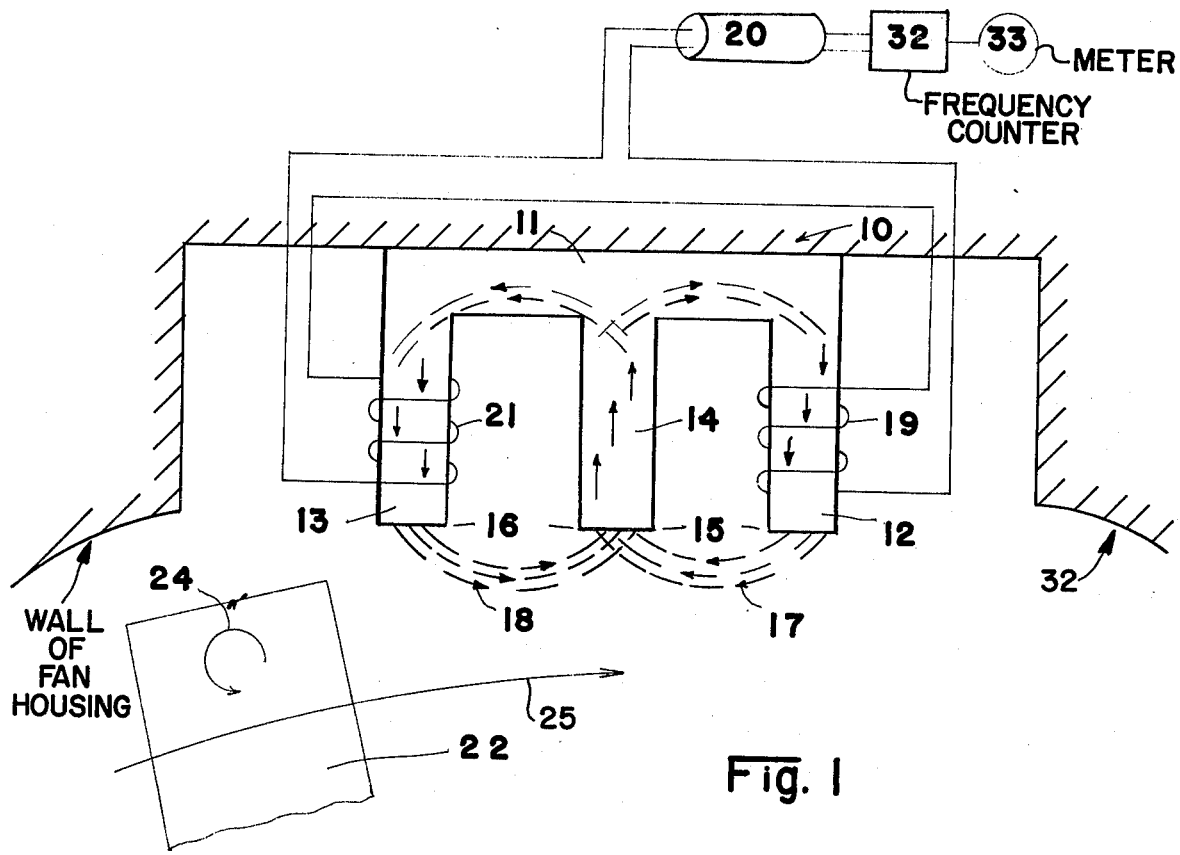
FIG. 1 shows a schematic representation of the sensor and its relationship to the fan blade of a turbine engine.

Referring now to FIG. 1 there is shown sensor core 10 having backing plate 11 made of ferro-magnetic material of rectangular cross section to which is rigidly and perpendicularly attached at one end by welding or other permanent means leg 12, also made of ferro-magnetic material. Similarly attached in the opposite end of backing plate 11 and extending in the same direction as leg 12 is leg 13 also made of ferro-magnetic material, legs 12 and 13 being of precisely the same length and cross section. Precisely centered between legs 12 and 13 and rigidly affixed to backing plate 11 is magnet 14 which establishes a quiescent magnetic flux and which is also rectangular in cross section and precisely the length of the legs 12 and 13, thus forming magnetic air gaps 15 and 16. It will be obvious to those skilled in the art that a flux field 17 and 18 is established by magnet 14 and that if the uppermost end of the magnet 14 is a north pole that the flux 17 will pass clockwise through the right-hand magnetic loop and the flux 18 will pass counterclockwise through the left-hand magnetic loop as clearly indicated. Tightly wound around leg 12 is winding 19 wound of a single conductor insulated wire, one end of which is connected to the first wire of output cable 20.

Similarly wound on leg 13 is winding 21 which is identical to winding 19 and connected, as shown, in series with winding 19 so that the two windings aid each other, the purpose for which will presently become clear. The other end of winding 21 is connected to the second wire of output cable 20.

When the flux field is undisturbed so that there is no change in the established quiescent magnet flux, no voltage is developed in the windings and there is no output voltage at cable 20.

Passing across the face of sensor core 10 from left to right cutting through the magnetic flux 17 and 18 is fan blade 22 made of electrically conducting but non-magnetic material which is attached to rotating turbine shaft 23 which is perpendicular to the plane of sensor core 10.

When fan blade 22 enters the flux field 18 of sensor core 10 eddy currents 24 are induced into the blade 22 which opposes the field 18 and as the blade 22 passes across the face of magnet 14 and into field 17, the eddy currents reverse since the field reverses again to oppose the established fields, thus when the quiescent flux is disturbed a magnetic change is first induced in flux loop 18 and therefore a voltage is induced in coil 21 and then a magnetic change is induced in flux loop 17 and a voltage is induced in coil 19, the effects of which will presently become clear.

The sensor 10 is preferably mounted, using conventional means, in a wall 32 of a fan housing forming part of a turbine engine.

Figure 2:
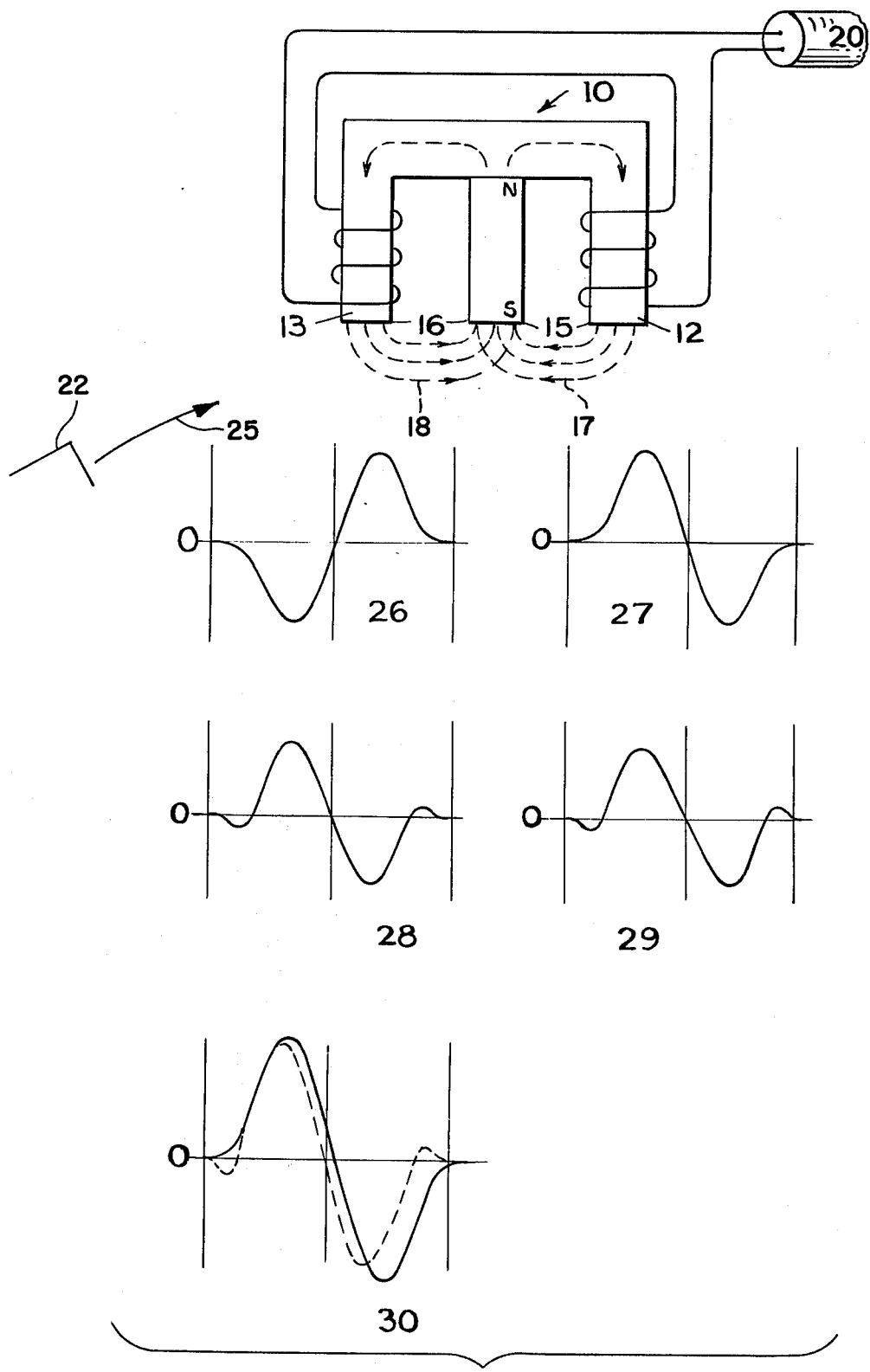
FIG. 2 shows a graph of the induced eddy currents in the blade and the change in the flux in each pole with respect to sensor and blade position during the passage of the blade and the voltages induced in the windings.

Referring to FIG. 2, there is shown sensor core 10 with flux fields 17 and 18 established across the air gaps 15 and 16, respectively. Directly below the pole faces of sensor core 10 are graphically depicted the effects of the eddy current disturbances with respect to the relative position of fan blade 22 or any conducting but non-magnetic material passed through flux field 17 and 18 in the direction indicated by arrow 25.

As the fan blade enters the flux field 18 eddy currents are induced which oppose the field and diminishes the flux density in leg 13 of sensor core 10, as depicted in curve 26 which is a graph of flux density changes in leg 13. This induced field being opposed to field 18 aids the flux field 17 in leg 12 of sensor core 10, thus the flux increases as shown in curve 27 which is a graph of flux density changes in leg 12.

As fan blade 22 leaves the flux field 18 and enters flux field 17, the eddy currents are reversed again to oppose the field and therefore diminishes the flux density in leg 12 of sensor core 10 and increases the flux density in leg 13 as clearly shown in curves 26 and 27. In these illustrations changes in the flux field are shown.

The voltages induced in windings 21 and 19 are shown in curves 28 and 29, respectively, and can be described as follows. As fan blade 22 enters flux field 18 the effective flux induced by the eddy currents in fan blade 22 in the leg 13 is upwardly which induces a voltage in winding 21 making the upper end positive and is illustrated by curve 28. The effective flux induced in leg 12 is downwardly inducing a similar voltage in winding 19 making its lower end positive, as illustrated by curve 29, thus because of being connected in series aiding the two voltages are additive as shown in curve 30 which illustrates the output voltage at cable 20. As the fan blade 22 passes into flux field 17, the eddy currents reverse causing the effective flux in leg 12 to be upward which induces a voltage in winding 19 making its upper end positive, as illustrated in curve 29, and the effective flux induced in leg 13 is downwardly inducing a similar voltage in winding 21 making the voltages additive but in the opposite direction as is clearly shown in curve 30.

The output cable may be connected to any one of a number of available frequency counting circuits shown at box 32 in FIG. 1 with conversion to a visual readout of speed on meter means 33 in FIG. 1. Such circuits are commonplace and well known to the art and are not shown since they are not the subject of this invention.

The novel construction described above allows the winding voltages induced by the fan blade to add, however, in general, other unwanted disturbances will subtract resulting in a sensor with a high signal to noise ratio. This result is very desirable since noise voltages due to shock, vibration and strong fields are greatly attenuated. This attenuation is accomplished in the manner now to be described.

Figure 3:
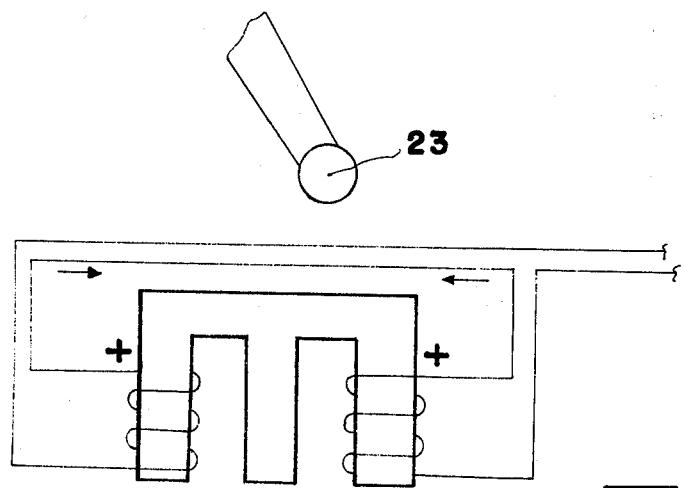
FIG. 3 depicts the flux change and induced voltage due to stray fields.
Figure 3:
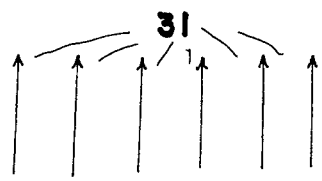

Referring to FIG. 3, there is shown the eddy current sensor with a stray flux field denoted by arrows 31. In this case the field opposes the flux in leg 12 of sensor core 10 inducing a voltage in leg 12 making the upper end of winding 19 positive and also opposes the flux in leg 13 inducing a voltage in leg 13 making the upper end of winding 21 also positive, the two voltages subtracting and resulting in an output of zero.

It will be obvious to those skilled in the art that any noise flux, no matter what the frequency or wave shape that impinges equally upon both windings at once will be entirely cancelled and the only noise that will be transmitted will be due to tolerances in manufacture or to flux fields which impinge upon the windings unequally which, because of the small size of the sensor, is unlikely to occur.

Because of its mode of operation the sensor can be completely enclosed in metal resulting in a sensor which is not susceptible to damage through abrasion or impact.

It should be obvious that this invention is not limited to speed sensing of turbines, but can be also used for counting of any conductive but non-magnetic materials.

That which is claimed is:

1. An eddy current sensing arrangement for developing a representation of velocity of a turbine engine by sensing eddy currents, which arrangement is substantially insensitive to common mode noise voltages due to stray fields, vibrations, shocks and the like, comprising, in combination:
   a. a plurality of fan blades of said turbine engine made from non-magnetic, conductive material,
   b. a magnetic core having an integrated back plate and a pair of outer legs offstanding in a plane normal to said back plate, each of said outer legs having a respective longitudinal axis,
   c. a central leg having a longitudinal axis and including magnet means interposed between and spaced from said outer legs, to thereby provide an air gap between said central leg and respective ones of said outer legs, said central leg establishing a magnetic flux clockwise through one leg of said outer legs and counter-clockwise through other leg of said outer legs,
   d. a first winding wound about one of said outer legs and a second winding wound about the other of said outer legs, said windings have respective winding axes and being connected in series, such that magnetic flux changes passing in opposite directions parallel to said winding axes through said first and second windings induce voltages in said first and second windings which reinforcingly add, and flux changes passing in the same direction parallel to the axes of said windings and through said windings induce voltages in the first and second windings which cancel, and
   e. means for rotatably mounting said plurality of fan blades made from non-magnetic, conductive material about an axis substantially perpendicular to a plane containing said longitudinal axis of said central legs for passage one after another in close proximity to said legs, each of said fan blades passing in close proximity to a first one of said outer legs, said central leg and the other of said outer legs in that order,
   f. said windings further including leads and an output cable, said legs of said magnetic core being positioned so that when any one of said non-magnetic fan blades made from non-magnetic, conductive material pass through the flux field of the first air gap, and then through the flux field of the second air gap, it induces a voltage in the first winding in one direction and a voltage in the second winding in the opposite direction, and as each of said members pass into the second air gap it induces a reverse voltage in said first and second windings thereby creating a discernible change in voltage which can be transmitted to a counter, whereby a representation of the velocity of said members may be developed substantially free from the influence of common mode noise, and g. a fan housing of said turbine engine having a wall wherein said magnetic core is mounted.

2. An arrangement as claimed in claim 1, wherein said windings are connected to a means for counting said fan blades per given interval of time as they pass the sensor to thereby determine the speed of rotation of said turbine engine.

3. A sensing arrangement for developing a representation of velocity of a driven fan by detecting the passage of fan blades of said driven fan made from a non-magnetic, electrically conductive material, which arrangement is substantially insensitive to common mode noise voltages due to stray fields, vibration, shock and the like, comprising, in combination:

a core of magnetic material having at least one longitudinal axis and two ends;

a permanent magnet member having a longitudinal axis and having one end affixed to said core intermediate said two ends of said core and its other end spaced from said core to thereby provide a first and a second air gap respectively between each of said two ends of said core and said other end of said magnet members, said permanent magnet member establishing a quiescent magnetic flux forming a first flux path from said other end through said first air gap and through one end of said core and back to said one end of said magnet and a second flux path from said other end through said second air gap and through the other end of said core and back to said one end of the magnet;

means for mounting said core and said permanent magnet member to a fan housing wall of said fan;

means for movably mounting said fan blades made from a non-magnetic, electrically conductive material about an axis substantially perpendicular to a plane containing said longitudinal axis of said magnet member and said at least one longitudinal axis of said core for passing them one after another through said first air gap and said second air gap in that order; and a differential voltage measuring arrangement comprising dual coils which are wound about said core on opposite sides of said magnet member and connected in series to add voltages induced in the coils due to passage of said members made of said non-magnetic, electrically conductive material through said first flux path and thence through said second flux path and to attenuate common mode voltages induced in said coils.

4. An arrangement as set forth in claim 3, further including means connected to said coils for detecting voltages induced in said coils and for counting number of passages of said fan blades of said non-magnetic conductive materials per given interval of time to thereby measure the speed of said driven fan.

* * * * *